United States Patent [19]
Kenkare et al.

[11] Patent Number: 5,881,016
[45] Date of Patent: Mar. 9, 1999

[54] METHOD AND APPARATUS FOR OPTIMIZING POWER CONSUMPTION AND MEMORY BANDWIDTH IN A VIDEO CONTROLLER USING SGRAM AND SDRAM POWER REDUCTION MODES

[75] Inventors: Sagar Waman Kenkare, Fremont; Dwarka Partani; Rakesh Bindlish, both of San Jose, all of Calif.

[73] Assignee: Cirrus Logic, Inc., Fremont, Calif.

[21] Appl. No.: 874,657

[22] Filed: Jun. 13, 1997

[51] Int. Cl.⁶ ..................................................... G11C 8/00
[52] U.S. Cl. ...................... 365/230.03; 365/203; 365/233
[58] Field of Search ............................... 365/230.03, 203, 365/233

[56] References Cited

U.S. PATENT DOCUMENTS

| | | | |
|---|---|---|---|
| 5,214,610 | 5/1993 | Houston | 365/233.5 |
| 5,276,652 | 1/1994 | Anami | 365/227 |
| 5,323,350 | 6/1994 | McLaury | 365/208 |
| 5,365,487 | 11/1994 | Patel et al. | 365/226 |
| 5,384,747 | 1/1995 | Clohset | 365/226 |
| 5,388,265 | 2/1995 | Volk | 395/750 |
| 5,430,683 | 7/1995 | Hardin et al. | 365/227 |
| 5,438,548 | 8/1995 | Houston | 365/227 |
| 5,442,588 | 8/1995 | Runas | 365/222 |
| 5,473,572 | 12/1995 | Margeson, III | 365/227 |
| 5,485,625 | 1/1996 | Gumkowski | 395/800 |
| 5,493,535 | 2/1996 | Cho | 365/230.04 |
| 5,495,444 | 2/1996 | Okubo et al. | 365/189.04 |
| 5,502,689 | 3/1996 | Peterson et al. | 368/156 |
| 5,506,810 | 4/1996 | Runas | 365/230.03 |
| 5,528,552 | 6/1996 | Kamisaki | 365/238.5 |
| 5,530,392 | 6/1996 | Runas et al. | 327/333 |
| 5,530,676 | 6/1996 | Sullivan et al. | 365/227 |
| 5,539,428 | 7/1996 | Bril et al. | 345/143 |
| 5,539,696 | 7/1996 | Patel | 365/230.03 X |
| 5,560,020 | 9/1996 | Nakatani et al. | 395/750 |
| 5,737,563 | 4/1998 | Shigeeda | 365/230.03 X |
| 5,745,428 | 4/1998 | Rao | 365/230.03 |
| 5,748,560 | 5/1998 | Sawada | 365/233 |

OTHER PUBLICATIONS

Hitachi, HM5283206 Series, 131,072–wordX32–bitX2–bank Synchronous Graphic RAM, ADE–203–223A(Z), Rev. 1.0, pp. 1 –79, Hitachi America, Ltd., May 30, 1996.

Samsung Graphic Memory Databook, Publication 1130–6011, pp. 179 –226, Jan. 1996.

*Primary Examiner*—Huan Hoang
*Attorney, Agent, or Firm*—Robert P. Bell; Steven A. Shaw

[57] ABSTRACT

The display controller of the present invention reduces power consumption by suppressing clock signals to a display memory (comprising SGRAM or SDRAM) between screen refreshes and memory accesses. The present invention takes advantage of power-down modes provided for SGRAM and/or SDRAM memories which are used in the prior art to place a memory in an active suspend mode. Further energy savings are realized and memory bandwidth increased when using a display memory comprising two banks. When one bank of memory is being accessed, the other bank of memory is precharged and activated. Succeeding pages of memory are placed in alternate banks of display memory. Thus, then data is to be accessed from a next page of memory, the corresponding bank is already charged and ready to be accessed.

18 Claims, 6 Drawing Sheets

METHOD AND APPARATUS FOR OPTIMIZING POWER CONSUMPTION AND MEMORY BANDWIDTH IN A VIDEO CONTROLLER USING SGRAM AND SDRAM POWER REDUCTION MODES

CROSS-REFERENCE TO RELATED APPLICATIONS

The subject matter of the present application is related to that in co-pending U.S. patent application Ser. No. 08/584,565, filed Jan. 11, 1996, entitled "FAST CYCLE TIME-LOW LATENCY DYNAMIC RANDOM ACCESS MEMORIES AND SYSTEMS AND METHODS USING THE SAME", incorporated herein by reference.

FIELD OF THE INVENTION

The present invention relates generally to display controllers (e.g., VGA, SVGA), graphics accelerators, flat panel controllers, and other types of computer display control systems. In particular, the present invention comprises a method and apparatus for reducing power consumption and optimizing data bandwidth in a display controller or the like using SGRAM or SDRAM.

BACKGROUND OF THE INVENTION

Conserving power consumption in computer systems is a well-known objective in the computer arts. In addition to prolonging battery life in portable computers, reducing power consumption in a computer system may result in real energy savings, particularly when multiplied by the large number of installed Personal Computers (PCs) in the world. The ENERGY STAR standard promulgated by the U.S. government requires that computers meeting this standard use no more than 60 Watts when idle.

Various control system are known for generating video displays on portable computers, PCs and other computing systems, including VGA and SVGA controllers, so-called graphics accelerators (e.g., 2D and 3D), flat panel display controllers, and the like. Such controllers may be referred to as "video controllers", however, with the advent of full motion video in computer systems, such a term may be a misnomer. For the purposes of this application, such a control system may be referred to a "display controller".

Figure 1:
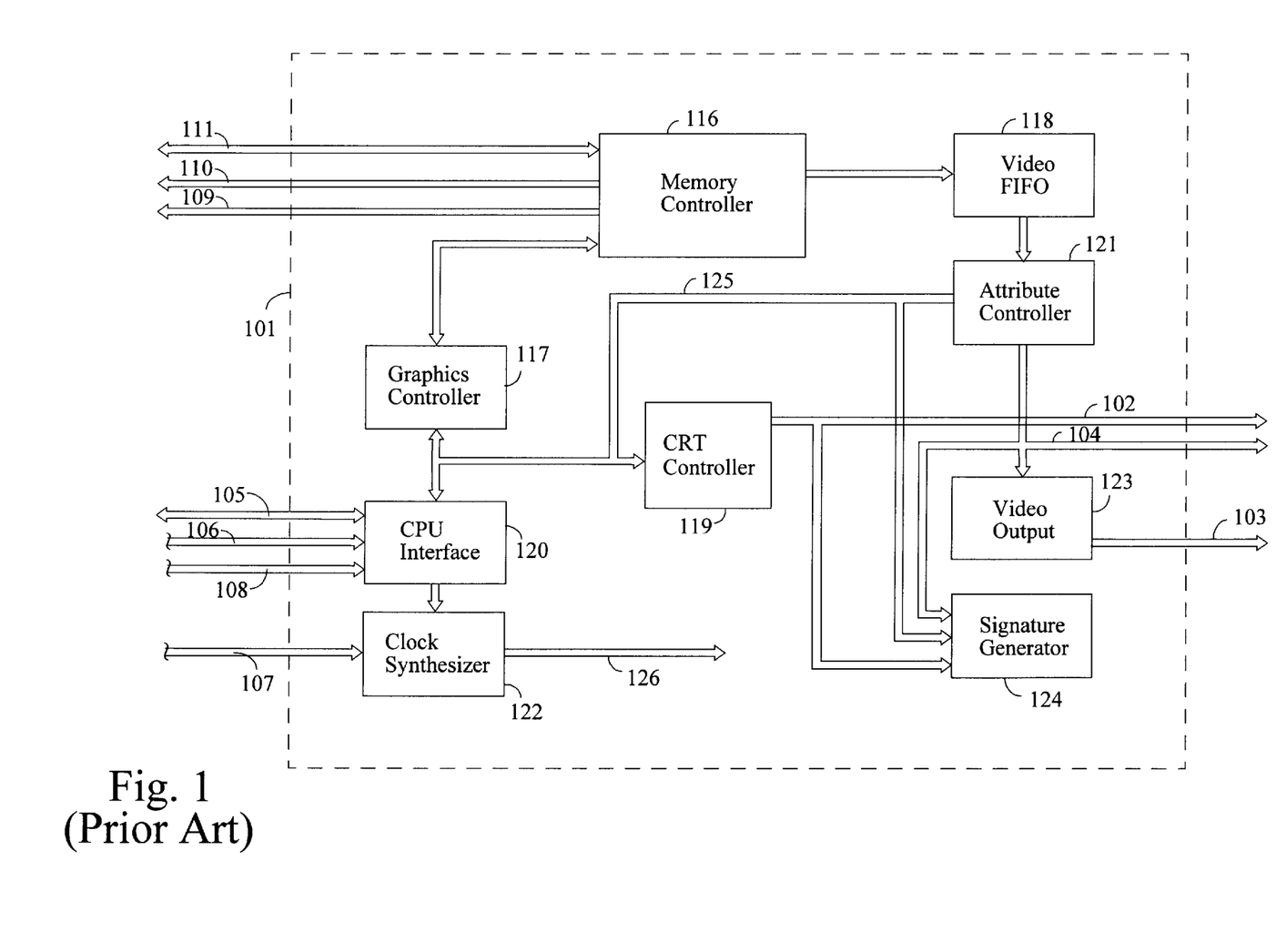
FIG. 1 is a block diagram of a prior art display controller.

FIG. 1 shows an example of a prior art display controller which is presented here for purposes of illustration only. Such a prior art display controller is disclosed, for example, in Bril et al., U.S. Pat. No. 5,539,428, issued Jul. 23, 1996 and incorporated herein by reference. The present invention may also be applied to other types of display controllers without departing from the spirit or scope of the invention.

Referring to FIG. 1 there is shown an internal block diagram of a display controller 101. System data may be written to display controller 101 via system data bus 105, system control bus 106, and system address bus 108 (hereinafter generally referred to as system busses 105, 106, 108) may pass through CPU interface 120 to control other elements of display controller 101 via an internal data and control bus 125. Status and other data may also be read from the other elements in display controller 101 via internal data and control bus 125, CPU interface 120 and system busses 105, 106, 108.

Data written to display controller 101, intended to be stored in an external video memory (not shown), may be written through and modified as necessary by graphics controller 117, then written to memory controller 116. Memory controller 116 drives appropriate values on video memory control bus 109 and video memory address bus 110, and drives data out on video memory data bus 111.

Memory controller 116 may also be responsible for reading memory data needed to define video data. Memory controller 116 may drive appropriate values on video memory control bus 109 and video memory address bus 110, and receives video memory data on video memory data bus 111. Video data is stored in an external video memory (not shown) coupled to video memory busses 109, 110 and 111.

In operation, video data from memory controller 116 passes through video FIFO 118, then is modified as necessary in attribute controller 121 before being output on video output data bus 104. Data on video output data bus is further modified by video output block 123, and driven out on video output 103. Video output block 123 may comprise, for example, a RAMDAC (Random Access Memory Digital to Analog Converter). Video signals entering the RAMDAC may comprise, for example, data which describe a color to be displayed.

Such data may define a number representative of a particular color, but not necessarily the color itself. The RAM portion of the RAMDAC contains a lookup table which converts this number into a digital signal representing a color value. The contents of the lookup table can be altered by software such that a particular color value can be assigned to a different number (or vice versa). The DAC portion of the RAMDAC converts this color value to an analog output, for example, analog VGA or the like, which is then transmitted on video output 103.

CRT controller 119 may generate signals for video output control bus 102. Memory controller 116, may use one of internal clocks 126. CRT controller 119, video FIFO 118, attribute controller 121, and video output 123 may use a different, asynchronous one of internal clocks 126. Techniques known in the art are used to synchronize the transfer of data from memory controller 116 to video FIFO 118. In normal operation, internal clocks 126 are generated by clock synthesizer 122, which may use system reference clock 107.

In the prior art, memory used with display controller 101 typically comprised conventional dynamic random access memory (DRAM). Such memories were relatively inexpensive and suitable for use with low resolution displays of relative static images (e.g., word processing, spreadsheets, simple CAD systems, and the like). However, with the advent of higher resolution displays with higher refresh rates, as well as the use of full motion video, 2-D and 3-D graphics, faster memories and display controller clock speeds have been employed. Memories with faster access techniques and interfaces have been employed (e.g., EDO DRAM, RDRAM, VRAM, and the like).

However, such memory devices may require higher power consumption due to the use of advanced MOS technology. Unlike conventional DRAMS, such memories may use the same amount of power regardless of whether they are being accessed. In the prior art, it is known to stop clock signals to memory devices during power reduction modes (e.g., a "sleep" or "suspend" mode, where clock signals to substantially an entire computer system are shut down or severely slowed). However, such a display memory may remain inactive between screen refreshes and CPU access for a significant amount of time, and thus consume power even when not in use.

SUMMARY OF THE INVENTION

The display controller of the present invention reduces power consumption by suppressing clock signals to a display memory (comprising SGRAM or SDRAM) between screen refreshes and memory accesses. The present invention takes advantage of power-down modes provided for SGRAM and/or SDRAM memories which are used in the prior art to place a memory in an active suspend mode.

When a display memory is being used, particularly in lower resolution modes where the display memory may be inactive between screen refreshes and memory accesses, the controller of the present invention will sense lack of activity (memory requests) to the display memory between such screen refreshes or memory accesses and generate a signal placing the display memory in an active suspend mode.

Further energy savings are realized and memory bandwidth increased when using a display memory comprising two banks. When one bank of memory is being accessed, the other bank of memory is precharged and/or activated. Succeeding pages of memory are placed in alternate banks of display memory. Thus, then data is to be accessed from a next page of memory, the corresponding bank is already charged and ready to be accessed.

By precharging and/or activating a bank during a memory cycle to the other bank, several clock cycles may be saved by eliminating precharge and activation delay time when switching between banks. By overlapping clock cycles during bank precharging and activation, the memory bandwidth may be increased. Moreover, overlapping clock cycles for bank precharging allows the display memory to be placed in active suspend mode sooner, thus further conserving power.

DETAILED DESCRIPTION OF THE INVENTION

The present invention conserves power in a display control system by altering control signals to a display memory comprising, in the preferred embodiment, Synchronous Graphics Random Access Memory (SGRAM) or Synchronous Dynamic Random Access Memory (SDRAM) in an active power-down mode. As their name implies, SGRAMS and SDRAMS output data in a synchronized fashion using a data clock. While such memory types may provide higher speed data access, they may also consume power whenever clocked, and thus drain energy even when access does not occur.

In order to conserve power in the display controller, therefor, it may be desirable to suppress clocking signals to SGRAMs and SDRAMs when display memory is not in use. When designing a display controller, it is necessary to provide sufficient data storage and data bandwidth capabilities to support the highest resolution and color depth modes for which a display controller is intended. Various different resolutions are known in display controllers, including 640× 480, 800×600, 1024×768, and 1280×1024.

Of course, higher resolutions are possible with additional memory and bandwidth. In order to be backward-compatible with legacy software and hardware, as well as provide user flexibility, a display controller may support more than one resolution mode, as selected by software or system drivers (e.g., Windows™ Setup Utility). Similarly, different color depths may require different amounts of display memory and bandwidth. Examples of various color depths include monochrome, 16 colors (4 bits per pixel, or bpp), 256 colors (8 bpp), 64K colors (16 bpp) 16M colors (24 bpp), and the like. Increased color depth requires additional data bits per pixel, and thus consumes more display memory and memory bandwidth.

In general, for a given display controller, various combinations of display resolution and color depth may be supported, with color depth usually inversely proportional to display resolution, due to display memory availability and display memory bandwidth. Special modes, such as full motion video, may add additional memory or bandwidth requirements. Moreover, increased refresh rates may add additional burdens to display memory bandwidth. A display controller may be designed with sufficient 'overhead' to insure seamless operation in the highest resolution/color depth modes.

Thus, for example, a display controller operating at 1024× 768 pixel resolution at 16M color depth may be operating at near the capacity of an associated display memory and display memory bandwidth. Standardized design criteria provide sufficient overhead to insure that display memory and display memory bandwidth limitations are not overrun, thus avoiding possible system crashes. The high performance display controller of the present invention may utilize SGRAM or SDRAM to provide the memory bandwidth necessary to achieve both high resolution and color depth.

However, when such a display controller is operating in a lower resolution or lower color depth mode, the display memory may be under-utilized. For example, it may be desirable to provide a lap-top or other portable computing device with a display controller capable of driving a high resolution monitor in a 'docked' mode. However, such a laptop, when portable, may operate in a lower resolution mode. Most laptops operate using flat panel displays (e.g., passive or active matrix LCDs) of fixed resolution (e.g., 800×600 pixels).

In such lower resolution modes, the display memory and display memory bandwidth may be under-utilized. As a result, the display memory may spend considerable time between screen refreshes in an idle state. For example, a display controller which has a capacity to display at a resolution of 1024×768 at 16M colors, when operating at a resolution of 640×480 at 256 colors, may require as little as 14% as much memory, and as a consequence 14% of the available memory bandwidth to refresh the display (assuming similar refresh rates).

Thus, when operating at such lower resolution modes, display memory may be inactive for approximately 86% of the time, or more, when using higher resolution display controllers. For the high performance controller of the present invention with a memory bandwidth of 880 MBytes/s, testing has indicated that operating in a 640×480 resolution mode, display memory may be used at little as 5% of the time, for 1024×768, as little as 40% of the time.

When the display memory comprises SGRAM or SDRAM, display memory is drawing considerable power, even when idle. Thus, if a technique can be established to shut down display memory quickly an efficiently during such idle times, considerable power savings may be achieved.

SGRAMs are described, for example, in the 1996 *Samsung Graphic Memory Databook*, Publication 1130–6011 (January 1996), incorporated herein by reference. As illustrated in Table I below, in standby mode, operating with a NOP (no operation) command, such a memory device may draw a maximum of 45 mA. However, in an active standby mode (clock suppressed), maximum current drops to approximately 3 mA.

SDRAMs are described, for example, in the *Hitachi Synchronous DRAM and Graphics Memory Data Book*, HM5283206 Series, incorporated herein by reference. As illustrated in the Hitachi data book, and Table I below, an SDRAM such as the HM5283206-15 may draw a maximum of 120 mA when in a normal operating mode. When in a standby mode, operating in a NOP command, such a device may draw a maximum of approximately 50 mA. However, with clock suppressed in an active standby mode, the device maximum current drops to approximately 10 mA.

TABLE I

| MODE | SGRAM | SDRAM |
| --- | --- | --- |
| Active | 120 mA | 120 mA |
| NOP | 45 mA | 55 mA |
| Active Standby | 3 mA | 10 mA |

In prior art devices, when such SDRAMs or SGRAMs are not being accessed, a display controller may place the display memory in a standby mode using a NOP (no operation) command. Active standby modes with clock suppression may normally reserved for sleep or suspend modes, where an entire computer system is put in low power mode for extended periods of time.

Prior art display controllers may not have been as concerned with power savings, and many laptop computers did not support high resolution graphics. Moreover, between screen refreshes, a display memory need to be maintained in a ready state for immediate access. Prior art suspend or sleep modes may require several clock cycles to transition to an active mode.

In addition, when used in prior art video controllers, SGRAM or SDRAM devices may typically use a NOP standby mode for energy savings, as such a mode may not require an additional pin on a video controller to activate a clock interruption circuit. Rather, a NOP standby mode may be accessed through software (i.e., NOP, or no operation command). Clock interruption techniques were typically reserved for sleep or suspend modes discussed above, where it may be desirable to shut down an entire computer system when not in use for extended periods of time.

Taking the example discussed above, if placed in an inactive mode using a NOP command (~50 mA versus ~120 mA active mode), assuming idle time of 86%, energy consumption may be reduced approximately 50% compared to an active state. However, in the present invention, display memory comprising SGRAM or SDRAM memory may be put in an inactive mode (clock suppressed) during inactive periods between screen refreshes. By using such severe low power modes, (e.g., ~5 mA versus ~120 mA active mode) the present invention, in the same example, may reduce power consumption over 80%.

Note that the calculation in the above examples presume that screen refreshes consume the majority of memory accesses to display memories. For most computer applications, the display image remains relatively constant from frame to frame, and thus CPU access to write to display memory may comprise a relatively small portion of memory access time. Other applications where the display image changes frequently may require more frequent writes to memory (e.g., video games, full-motion video, and the like), reducing energy savings accordingly.

Figure 2:
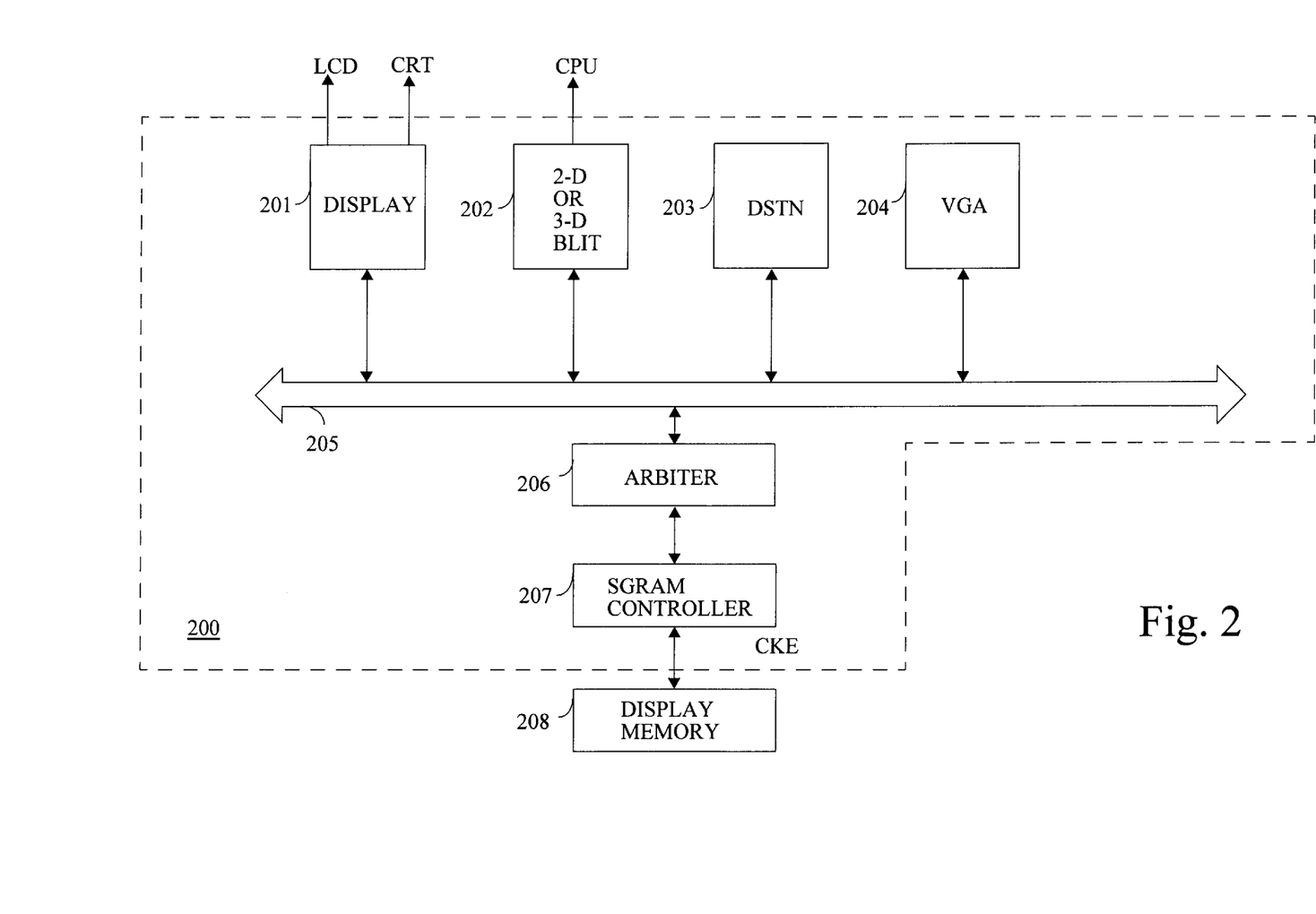
FIG. 2 is a block diagram illustrating the major components of display controller of the present invention.

In order to take advantage of such low power operating modes, display memory must be activated and deactivated in a manner such that interruptions do not occur and the technique is transparent to operating software. FIG. 2 is a block diagram illustrating the major components of display controller 200 of the present invention. Various components are illustrated interconnected through internal display bus 205. Display block 201 may receive display data over display bus 205 and output digital signals which may drive a flat panel display (e.g., LCD) or analog signals to drive a CRT display.

2-D or 3-D BLIT operation block 202 may comprise a so-called "blit engine" or "blitter" which performs bit block transfers and bit block transfer functions. 2-D or 3-D BLIT operation block 202 may interface with a host CPU to receive data from a host CPU and output data to display bus 205 to be stored in display memory 208. As is known in the art, 2-D or 3-D BLIT operation block may also perform bit block operations on received data prior to transmitting such data to display memory 208. Such bit block transfer functions may aid in 2-D or 3-D rendering of images.

DSTN block 203 may provide control signals to operate display controller 200 to drive a dual scan super-twist neumatic display. Such a display, to avoid flicker, may divide a typical panel (e.g., 800×600 into two parts 400×600 each, and refresh each half separately. DSTN block 203 provides logic control signals to control display memory 208 accordingly.

VGA block 204 may provide control signals to operate display controller 200 according to VGA and SVGA protocols. VGA clock 204 may include a VGA BIOS instruction set to control display controller 200 and format data according to the VGA standard.

Arbiter 206 arbitrates which of blocks 102, 202, 203, 204, or other blocks (not shown) communicate with display memory 208. Arbiter 206, for example, resolves conflicts between display block 201, which receives data from display memory 208 to refresh a flat panel or CRT display, and 2-D or 3-D BLIT operation block, which updates image data stored in display memory 208.

SGRAM Controller 207 provides an interface between arbiter 206 and display memory 208. Display memory 208 may comprise, for example, an SGRAM or SDRAM memory. For the purposes of illustration in the present application, display memory will be referred to as an SGRAM memory, however, similar principles may be applied to an SDRAM memory as well.

Whenever any of blocks 201, 202, 203, 204, or other blocks (not shown) generates a memory request over display bus 205, arbiter 206 follows a protocol to determine which block generating a memory request has priority. For example, since a CRT requires refreshes at a periodic rate (e.g., 60 Hz, 72 Hz, 75 Hz, or the like), display block 201 may have priority over 2-D or 3-D BLIT operation block 202. 2-D or 3-D BLIT operation block 202 may be forced to wait until display block 201 has completed a screen refresh before access to display memory 208 is permitted.

By monitoring such memory access requests within arbiter 206, SGRAM controller 207 may determine dynamically whether display memory should be placed in active or inactive modes. If no memory requests are pending, display memory 208 may be placed in an active standby mode. Display memory 208 should be reactivated to an active mode within one clock cycle of receipt of a memory access request. In the preferred embodiment of the present invention, SGRAM controller may activate/deactivate display memory 208 through use of a dedicated clock enable (CKE) pin or the like.

Figure 3:
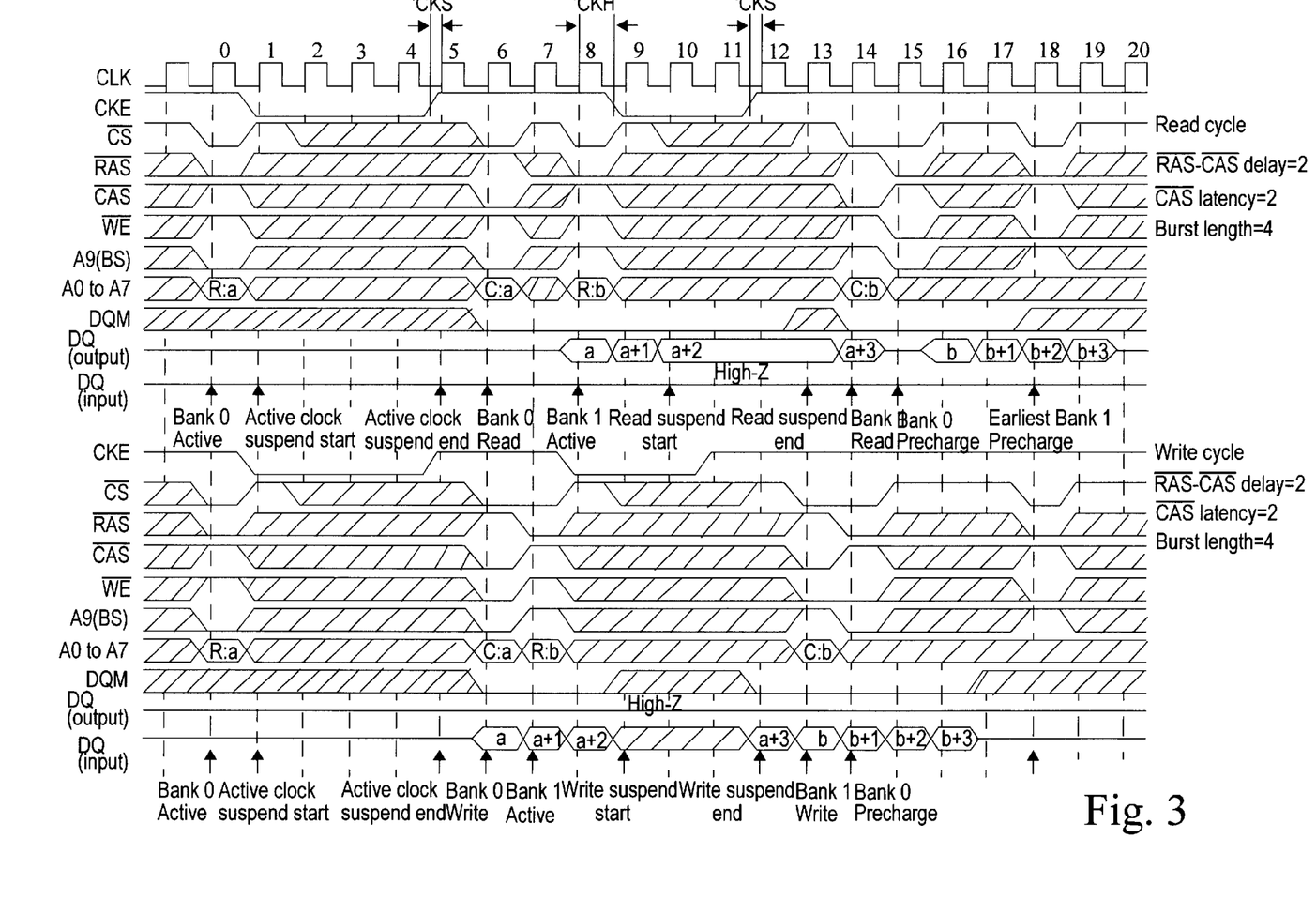
FIG. 3 is a waveform diagram for an SGRAM illustrating operation of an SGRAM memory during a clock suspend mode.

FIG. 3 is a waveform diagram illustrating the operation of an SDRAM memory in a clock suspend (i.e., active standby) mode. The waveform diagram of FIG. 3 is taken from the Hitachi HM5283206 series Synchronous Graphics RAM data Book, (page 69) incorporated herein by reference.

As illustrated in FIG. 3, the clock signal CLK for an SDRAM memory (which may comprise display memory 208 of FIG. 2) remains free-running throughout the active standby (clock suspend) mode. The setup and hold time for the active standby mode signal CKE is slightly different than all other signals. To avoid this problem, and to save a pin (output) from SGRAM controller 207, prior art display controllers may tie signal CKE to a high logic level and utilize a NOP standby mode.

Setup and hold times refer to the amount of time necessary to enter a NOP state (i.e., timing with respect to clock). Display memory 208 looks at signal CKE at every clock rising edge. If there are no requests (request or grant signals go high during memory access) on bus 205, arbiter 206 will determine there are no memory requests. If there are no such requests, then arbiter 206 determines that display memory 208 is not going to be used and it may be placed in an active power-down mode.

Figure 4:
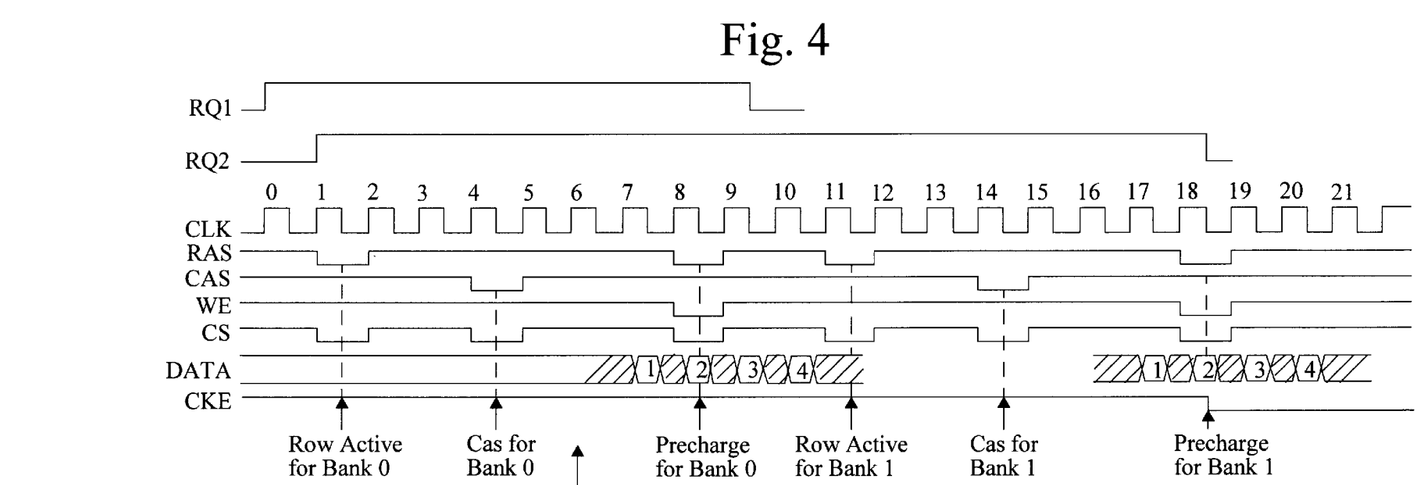
FIG. 4 is a waveform diagram illustrating the operation of bank precharging in the prior art.

Referring now to FIG. 4, at the rising edge of clock signal CLK, clock enable signal CKE may go low, as directed by arbiter 206 through SGRAM controller 207 of FIG. 2. At the next rising edge of clock signal CLK, display memory 208 is placed in active standby mode. Clock CLK is free-running, and any number of clock cycles may elapse while display memory 208 is in active standby mode.

When display memory 208 is to be accessed, as determined by arbiter 206, clock enable signal CKE is raised high. At the very next rising edge of clock signal CLK, display memory 208 will exit active standby mode. The entire process of entering or exiting active standby mode takes only one clock cycle, as arbiter 206 itself will take one clock to arbitrate incoming data requests. Thus, access to display memory 208 is not additionally delayed.

Figure 6:
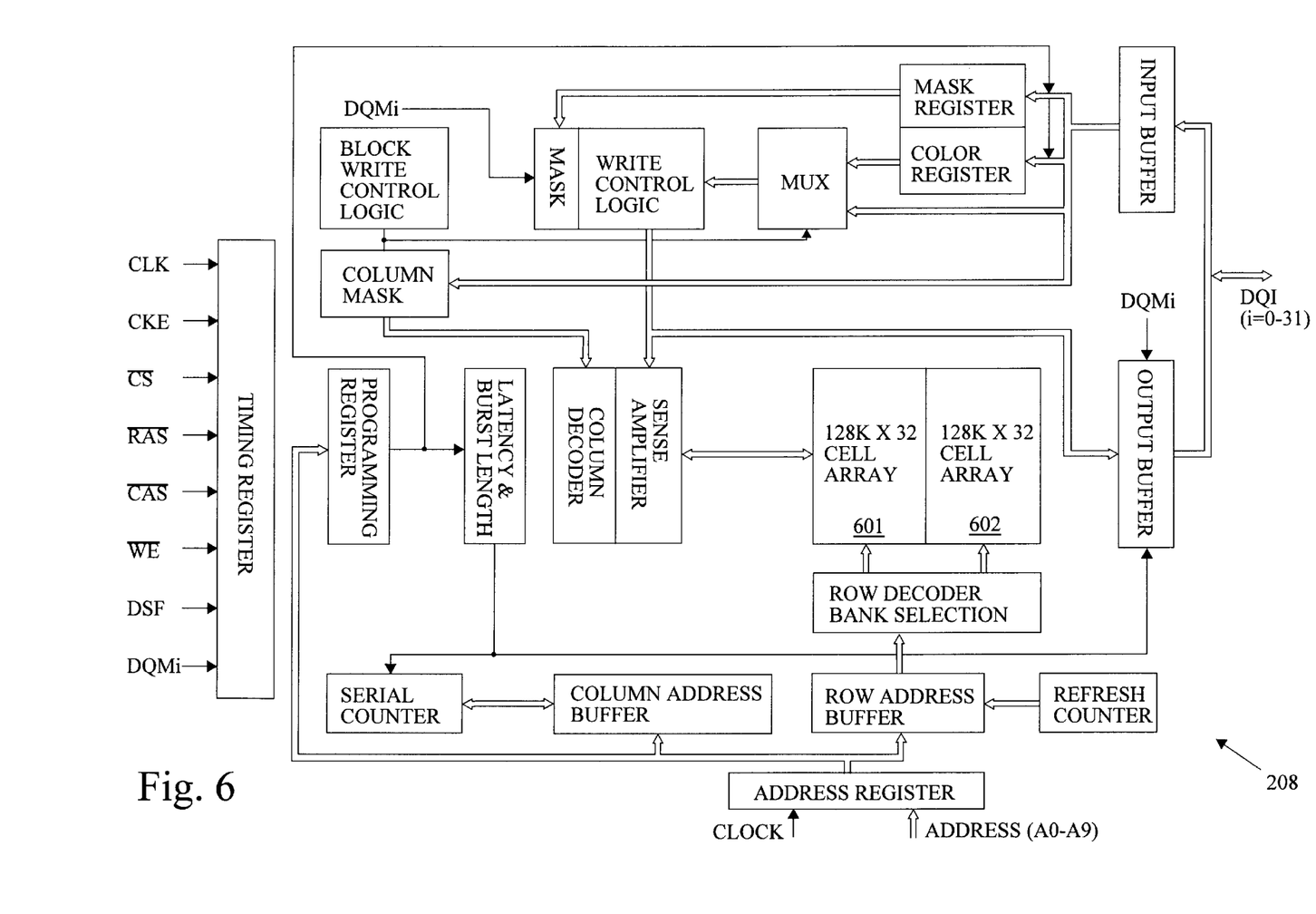
FIG. 6 is a block diagram of a SGRAM memory illustrating the use of dual banks of memory.

Synchronous memories may have an architecture, as illustrated in FIG. 6, provided with two different blocks of cell arrays 601, 602, which may be accessed independently. As illustrated in FIG. 6, asynchronous SDRAM or SGRAM may comprise a core of standard which is provided with logic circuits to generate synchronous data reads and writes. Cell arrays 601, 602 are arranged as rows and columns.

Whenever memory 208 is to be accessed, a particular bank is selected and then may need to be precharged. Precharging of a bank may take, depending upon memory design, several clock cycles. Once the bank is precharged, a row is selected by a Row Address Strobe (RAS) and data is clocked out, column by column, by the Column Address Strobe (CAS). In synchronous memory, a starting column address may be provided, and the synchronous memory may internally increment the address to the next location. Clock signal CLK may be used to increment the column addresses.

A user may also specify burst length, for example, four locations, eight locations, or a full page (256 locations). Depending on burst length, display memory 208 will provide the corresponding amount of data. Each location represents a number of bits depending upon memory configuration. If using a byte-32 SRAM, then 32 bits, if Byte-8, then 8 bits, and the like.

In synchronous memory, addresses are incremented inside the memory by the memory clock CLK and data output. The CAS signal need not be toggled to output data. Such synchronous techniques improve speed, as they save a clock cycle between accesses. Thus, synchronous memories may be capable of speeds up to 100 MHz or 133 MHz, against a standard DRAM which may run at speeds of 60 MHz or 80 MHz.

Within the row address, one bit (e.g., MSB) may indicate which bank is to be selected (e.g., Bank Select). If Bank Select is zero, bank 0 is accessed, if it is one, it accesses bank one. When switching from bank 0 to bank 1, there is a minimum precharge time ($t_{ras}$) of bank 0 before data can be accessed from the page. In the prior art, precharge, depending on the speed of the memory, may take as many as three or four clock cycles.

FIG. 4 is timing diagram illustrating two successive read operations from different banks in a using conventional techniques. Two read requests RQ1 and RQ2 are received by a prior art display controller. Read request RQ1 is a read request to read data from bank 0 of a prior art dual-bank display memory. Read request RQ2 is a read request to read data from bank 1 of a prior art dual-bank display memory.

Figure 5:
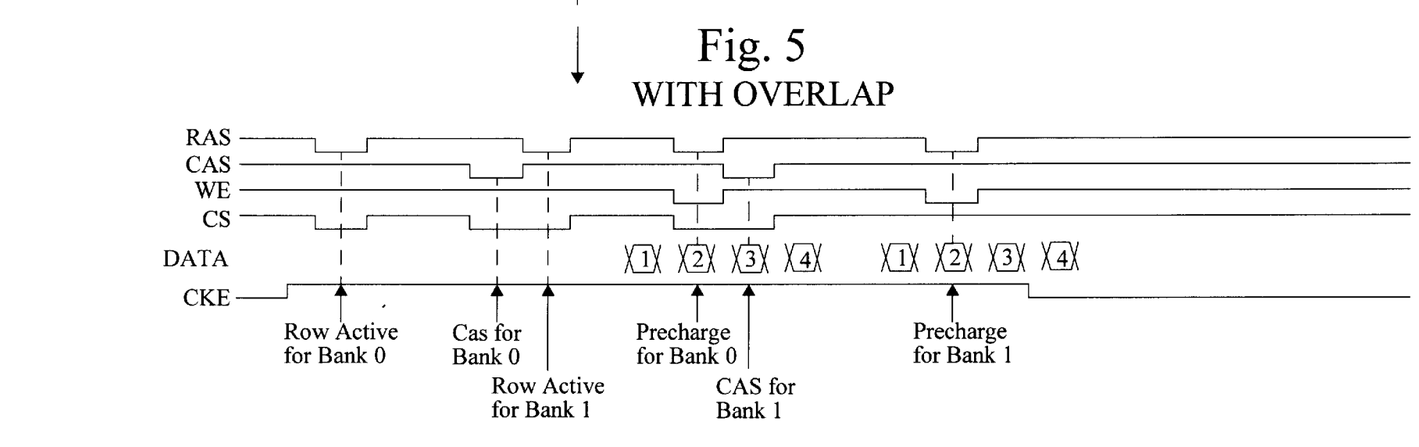
FIG. 5 is a waveform diagram illustrating the operation of bank precharging in the present invention.

Note that FIGS. 4 and 5 illustrate two consecutive read requests. However, the overall scheme of FIGS. 4 and 5 may be applied to write requests or a combination of read and write requests, as one of ordinary skill in the art may appreciate. In addition, whether a particular read request is directed toward a particular bank may be determined by reading a corresponding bit or bits from the associated memory address accompanying a read request (e.g., MSB, LSB, or the like).

Various memory parameters may be set in display controller hardware (e.g., registers) by system software (e.g., VGA BIOS) determining how the memory may be read and setting various memory parameters. In the Example of FIGS. 4 and 5, the following memory parameters are set as follows:

| | |
|---|---|
| $t_{RRD}$ = 3 clocks; | Minimum RAS to RAS timing - the minimum number of clock cycles that the memory will require between RAS assertions between banks. |
| $t_{RAS}$ = 6 clocks; | RAS to RAS timing - the minimum number of clock cycles that the memory will require between RAS assertions within the same memory bank. |
| $t_{RCD}$ = 3 clocks; | RAS to CAS delay - the minimum number of clock cycles that the memory will require between RAS assertion and a CAS assertion. |
| CAS Latency = 3 clocks; | The minimum number of clock cycles that the memory will require between a CAS assertion and data output. |
| $t_{RP}$ = 3 clocks; | Precharge Time - The minimum number of clock cycles required to precharge a bank of memory. |
| BL = 4 units; | Burst Length - number of units of memory which will be output per read cycle. Size of units depends upon memory width and configuration. |

Of the parameters listed above, $t_{RRD}$, $t_{RAS}$, $t_{RCD}$, CAS Latency, and $t_{RP}$ depend upon the memory specifications as set by the manufacturer of the memory. Burst Length BL may be set by the system designer or software, and in the preferred embodiment is set to four units. Note that all parameters except burst length BL are set in terms of number of memory clock cycles CLK illustrated in FIG. 4.

Referring back to FIG. 4, when read request RQ1 is asserted, signal RAS and CS (chip select) are asserted one clock cycle later. It is presumed that in FIG. 4, the memory is already precharged prior to the first memory cycle, so no precharge delay occurs during this first cycle. Chip select signal CS may be used to activate the display memory. When using multiple memory chips, chip select signal CS may selectively select or de-select a particular chip or chips. When signal RAS and CS are asserted, a row corresponding to an associated row address is active for bank 0 of the display memory.

After three clock cycles for RAS to CAS delay $t_{RCD}$, signals CAS and CS are asserted to select a column corresponding to an associated column address for bank 0 of the display memory. After a CAS latency delay of three clock cycles, Four units of data are output as illustrated in FIG. 4 and the first memory cycle is completed.

The RAS to RAS timing parameter $t_{RAS}$ is a minimum of six clock cycles, and thus signal RAS, CS, and write enable signal WE are asserted six clock cycles after the initial RAS assertion, even though, as illustrated in FIG. 4, read request RQ2 is asserted one clock cycle after read request RQ1. Asserting signals RAS, CS and WE together signals the display memory to precharge the bank of memory, in this instance, bank 0, for a subsequent memory cycle.

After three clock cycles for precharge delay $t_{RP}$, signals RAS and CS are asserted to activate a row corresponding to an associated row address for bank 1 of the display memory. Again, as in the previous memory cycle, a RAS to CAS $t_{RCD}$ of 3 cycles occurs, after which signals CAS and CS are asserted to select a column corresponding to an associated column address for bank 1 of the display memory. After a CAS latency delay of three clock cycles, four units of data are output as illustrated in FIG. 4 and the second memory cycle is completed.

Note that in FIG. 4, the first memory cycle takes approximately ten clock cycles to complete. The second memory cycle may take up to thirteen memory cycles to complete, as an additional three clock cycles may be required to precharge a bank of memory. When continuously reading from bank to bank, each memory cycle may require up to thirteen clock cycles (more or less, depending upon memory configuration) to complete. Note that FIG. 4 illustrates two sequential read cycles. However, the principles illustrated in FIG. 4 may be applied to sequential read/write cycles or to sequential write cycles with similar results.

FIG. 5 is a timing diagram illustrating the operation of SGRAM controller 207 of the present invention. FIGS. 4 and 5 are illustrated synchronous to one another, and thus signals CLK, RQ1, and RQ2 are omitted from FIG. 5 for the sake of clarity. FIG. 5 again starts from an initial precharged condition (e.g., reset), and thus no precharge is necessary to access bank 0.

One clock cycle after read request RQ1, signals RAS and CS are asserted, and a row corresponding to an associated row address is active for bank 0 of the display memory. After three clock cycles for RAS to CAS delay $t_{RCD}$, signals CAS and CS are asserted to select a column corresponding to an associated column address for bank 0 of the display memory.

After a CAS latency delay of three clock cycles, four units of data are output as illustrated in FIG. 5 and the first memory cycle is completed.

However, in FIG. 5, bank 1 is activated earlier by asserting signals RAS and CS immediately after signals CAS and CS are asserted, or four clock cycles ($t_{RRD}$) after RAs is initially asserted. While data is being read out for the first memory cycle from bank 0, bank 1 is activated. Three clock cycles later, signals RAS, We and CS are asserted to initiate a precharge for bank 0. As three clock cycles for RAS to CAS delay $t_{RCD}$ have already elapsed, signals CAS and CS may be immediately asserted after the bank 0 precharge signal to select a column corresponding to an associated column address for bank 1 of the display memory. After a CAS latency delay of three clock cycles, four units of data are output as illustrated in FIG. 5 and the second memory cycle is completed.

By activating bank 1 four cycles after the initial RAS assertion, and asserting CAS immediately after precharging bank 0, a total of up to five clock cycles may be saved, reducing access time by 39 to 50%, depending upon the number of sequential memory cycles and memory parameters. When access time is reduced, available memory bandwidth is increased. Moreover, display memory may be placed in active suspend mode much sooner, this further conserving energy.

In the preferred embodiment, memory may be addressed in such a way that successive request access different banks. Thus, access N may be in bank 0, and access N+1 may be in bank 1. If a subsequent access was in the same bank, then it may not be directly accessible, as that same bank may need to be again precharged before access can take place. Thus, it is faster to put sequential accesses in different banks of memory. If display memory 208 is arranged in such a way that sequential accesses go in different banks, while waiting for one bank to precharge and activate, the other bank may be accessed.

SGRAM controller 207, by looking forward, determines whether a next memory access will be in the same bank or a different bank. If the next memory access is in a different bank, there is no need to wait for the current request or activity to be over before precharging and activating the other bank of memory, thus reducing the number of clock cycles between successive memory accesses. SGRAM controller 207 may determine whether a memory request is destined for a particular bank of memory by reading one bit of the memory address (e.g., MSB, LSB). For example, address bit 8 or 9, (depending upon memory width) may determine whether a memory access is to be made to bank 0 or bank 1. SGRAM controller 207 monitors the address and determines which bank the address is in.

Figure 7:
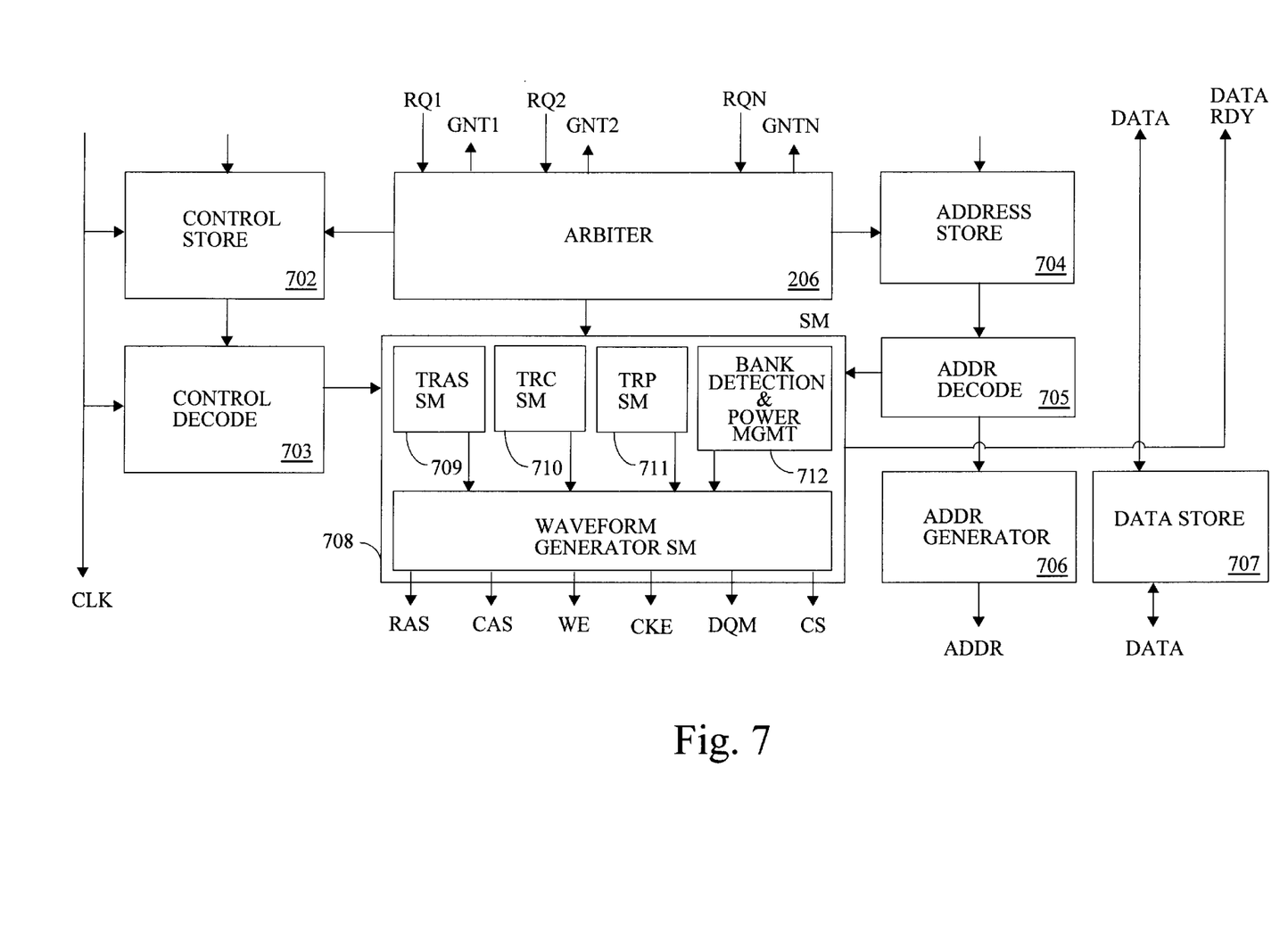
FIG. 7 is a block diagram of arbiter 206 and SGRAM controller 207 of FIG. 2.

FIG. 7 is a block diagram of arbiter 206 and SGRAM controller 207 of FIG. 2. Arbiter 206 receives a number of memory access requests RQ1 through RQN and generates memory access grant signals GNT1 through GNTN, where N is the number of devices which may request access to display memory 208. Arbiter 206 determines which requester has the highest priority and grants access to the device having the highest priority. For example, display controller 201 may have a higher priority than access from the CPU, as a steady stream of pixel data is continually needed to refresh the CRT or other display.

Control store 702 receives control signals (e.g., READ, WRITE, and the like) from a device which has been granted access to display memory 208. Address store 704 stores display memory addresses to be accessed by the device granted access to display memory 208.

For the sake of illustration, memory request and grant signals, control and address signals and data and data ready signals are not individually shown in FIG. 2. Such signals may interface with internal display bus 205, as can be appreciated by one of ordinary skill in the art in view of the present disclosure. Similarly, signals CLK, RAS, CAS, WE, CKE, DQM, CS, ADDR and DATA interface with display memory 208.

Control decoder 703 decodes control commands (e.g., READ, WRITE, and the like) and outputs command signals to state machine (SM) 708. Address decoder 705 decodes display memory addresses and outputs signals indicating which bank, row and column correspond to an input address. Address generator 706 may receive decoded address data from address decoder 705 and output an address to display memory 208.

Data store 707 may act as a buffer to receive data from display memory 208 and output data to bus 205. Data ready signal DATA RDY may be generated by state machine 708 and output to bus 205 to indicate data is present in data store 707.

State machine 708 may comprise a number of individual state machines, including $t_{RAS}$ state machine 709, $t_{RC}$ state machine 710, and $t_{RP}$ state machine 711.

$t_{RAS}$ state machine 709 is the row active timing state machine keeps track of row active timing as discussed above in connection with FIGS. 4 and 5 to insure that a minimum number of clock cycles ($t_{RAS}$) are completed between row accesses within a single bank. Similarly, $t_{RC}$ state machine 710 keeps track of the row cycle timing to insure that a minimum number of clock cycles ($t_{RC}$) occur between RAS and CAS signals. $t_{RP}$ state machine 711 keeps track of the number of clock cycles needed to precharge a bank of memory before allowing access to that bank.

Waveform generator state machine 713 generates RAS, CAS, WE, CKE, DQM, and CS signals which in turn are output to display memory 208. Signal DQM indicates which bytes are being masked and other bytes are accessed.

Bank detection and power management state machine 712, coupled to address decoder 705, may determine from input address data which bank is to be addressed. In addition, when no data requests are received from arbiter 206, bank detection and power management state machine 712 may generate output signals, as discussed above, to place display memory in an active power-down state.

By reducing precharge and activation delays, the present invention also saves power. In the present invention, each page access may be compressed by as many as five clock cycles. As the time needed to access the memory has been reduced, the memory may be shut down that much sooner to save power. Thus, saving time is saving power. If a separate precharge and activation cycle was required, the overall memory cycle time would be longer, and thus the memory would be active longer, consuming more power.

Although the present invention has been illustrated and described in detail, it is clearly understood that the same is by way of illustration and example only and is not to be taken by way of limitation, the scope and spirit of the present invention being limited only the terms of the appended claims.

For example, although illustrated herein as being used with a dual-bank memory, the present invention may be similarly applied to display memories having multiple banks (e.g., four) either provided within one chip, or on multiple chips. Moreover, although illustrated herein as being used for a discrete display memory in the preferred embodiment, the techniques of the present invention may also be applied to a display controller having an integrated (i.e., on-board) memory.

What is claimed is:

1. A method for controlling a multi-bank display memory comprising the steps of:

monitoring an address for read and write requests to the multi-bank display memory to determine which bank of the multi-bank display memory is to be accessed, precharging and activating a one bank of the multi-bank display memory not being accessed while an other bank of the multi-bank display memory is being accessed, and placing the multi-bank display memory in an active suspend mode between memory access requests.

2. The method of claim 1 wherein successive pages of data are stored in alternate banks of said multi-bank display memory, and said step of monitoring an address comprises the steps of:

reading a predetermined bit of an address for the multi-bank display memory, determining the address is for one bank of the multi-bank display memory if the bit has a first value, and determining the address is for an other bank of the multi-bank display memory if the bit has a second value.

3. The method of claim 2, wherein said step of placing the multi-bank display memory in an active suspend mode comprises the steps of:

generating a clock disable signal in response to an absence of memory requests for the multi-bank display memory, transmitting the clock disable signal to the multi-bank display memory, and placing the multi-bank display memory in an active suspend mode with a clock signal to the multi-bank display memory disabled.

4. The method of claim 3, wherein said step of monitoring an address further comprises the steps of:

receiving memory access requests for the multi-bank display memory comprising at least screen refresh read requests and write requests from a host processor, and arbitrating between the at least screen refresh read requests and write requests from a host processor.

5. An apparatus for controlling a multi-bank display memory comprising:

address monitoring means for monitoring an address for read and write requests to the multi-bank display memory to determine which bank of the multi-bank display memory is to be accessed;

bank precharging and activating control means, coupled to said address monitoring means, for precharging and activating a one bank of the multi-bank display memory not being accessed while an other bank of the multi-bank display memory is being accessed; and multi-bank display memory suspend control means, coupled to said address monitoring means, for placing the multi-bank display memory in an active suspend mode between memory access requests.

6. The apparatus of claim 5 wherein successive pages of data are stored in alternate banks of said multi-bank display memory, and said address monitoring means comprises:

means for reading a predetermined bit of a memory address for the multi-bank display memory; and means for determining an address is for one bank of the multi-bank display memory if the bit has a first value and determining an address is for an other bank of the multi-bank display memory if the bit has a second value.

7. The apparatus of claim 6, wherein the multi-bank display memory suspend control means comprises:

means for generating a clock disable signal in response to an absence of memory requests for the multi-bank display-memory; and means for transmitting the clock disable signal to the multi-bank display memory, wherein the multi-bank display memory is placed in an active suspend mode with at least one bank of the multi-bank display memory in an active state with a clock signal to the multi-bank display memory disabled.

8. The apparatus of claim 7, wherein said address monitoring means further comprises:

means for receiving memory access requests for the multi-bank display memory comprising at least screen refresh read requests and write requests from a host processor; and means for arbitrating between the at least screen refresh read requests and write requests from a host processor.

9. A method for controlling a multi-bank display memory comprising the steps of:

monitoring an address for read and write requests to the multi-bank display memory to determine which bank of the multi-bank display memory is to be accessed, and precharging and activating a one bank of the multi-bank display memory not being accessed while an other bank of the multi-bank display memory is being accessed wherein successive pages of data are stored in alternate banks of said multi-bank display memory, and said step of monitoring an address comprises the steps of:

reading a predetermined bit of a memory address for the multi-bank display memory, determining the address is for one bank of the multi-bank display memory if the bit has a first value, and determining the address is for an other bank of the multi-bank display memory if the bit has a second value.

10. The method of claim 9, wherein said step of monitoring an address further comprises the steps of:

receiving memory access requests for the multi-bank display memory comprising at least screen refresh read requests and write requests from a host processor, and arbitrating between the at least screen refresh read requests and write requests from a host processor.

11. An apparatus for controlling a multi-bank display memory comprising:

address monitoring means for monitoring an address for read and write requests to the multi-bank display memory to determine which bank of the multi-bank display memory is to be accessed; and bank precharging and activating control means, coupled to said address monitoring means, for precharging and activating a one bank of the multi-bank display memory not being accessed while an other bank of the multi-bank display memory is being accessed wherein successive pages of data are stored in alternate banks of said multi-bank display memory and said address monitoring means comprises:

means for reading a predetermined bit of a memory address for the multi-bank display memory; and means for determining the address is for one bank of the multi-bank display memory if the bit has a first value and determining the address is for an other bank of the multi-bank display memory if the bit has a second value.

12. The apparatus of claim 11, wherein said address monitoring means further comprises:

means for receiving memory access requests for the multi-bank display memory comprising at least screen refresh read requests and write requests from a host processor; and means for arbitrating between the at least screen refresh read requests and write requests from a host processor.

13. A method for controlling a display memory comprising the steps of:

monitoring an address for read and write requests to the display memory to determine whether the display memory is to be accessed, and placing the display memory in an active suspend mode between memory access requests.

14. The method of claim 13, wherein said step of placing the display memory in an active suspend mode comprises the steps of:

generating a clock disable signal in response to an absence of display memory requests, transmitting the clock disable signal to the display memory, and placing the display memory in an active suspend mode with at least one bank of the display memory in an active state with a clock signal to the display memory disabled.

15. The method of claim 14, wherein said step of monitoring an address further comprises the steps of:

receiving display memory access requests comprising at least screen refresh read requests and write requests from a host processor, and arbitrating between the at least screen refresh read requests and write requests from a host processor.

16. An apparatus for controlling a display memory comprising:

address monitoring means for monitoring an address for read and write requests to the display memory to determine whether the display memory is to be accessed; and display memory suspend control means, coupled to said address monitoring means, for placing the display memory in an active suspend mode between memory access requests.

17. The apparatus of claim 16, wherein said display memory suspend control means comprises:

means for generating a clock disable signal in response to an absence of display memory requests; and means for transmitting the clock disable signal to the display memory, wherein the display memory is placed in an active suspend mode with at least one bank of the display memory in an active state with a clock signal to the display memory disabled.

18. The apparatus of claim 17, wherein said address monitoring means further comprises:

means for receiving display memory access requests comprising at least screen refresh read requests and write requests from a host processor; and means for arbitrating between the at least screen refresh read requests and write requests from a host processor.

* * * * *